(12) United States Patent
Cheng et al.

(10) Patent No.: US 6,788,092 B2
(45) Date of Patent: Sep. 7, 2004

(54) TEST ASSEMBLY FOR INTEGRATED CIRCUIT PACKAGE

(75) Inventors: Po Jen Cheng, Kaohsiung (TW); Chiu Wen Lee, Linyuan Hsiang (TW); Jin Zhu Lee, Kaohsiung (TW); Heng Yu Kung, Linyuan Hsiang (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 10/121,650

(22) Filed: Apr. 15, 2002

(65) Prior Publication Data

US 2003/0193344 A1 Oct. 16, 2003

(51) Int. Cl.[7] .............................................. G01R 31/26
(52) U.S. Cl. ...................................................... 324/765
(58) Field of Search ................................ 324/765, 754, 324/758, 158.1; 438/14–18; 257/723–724, 700, 764, 704; 174/255, 260–265

(56) References Cited

U.S. PATENT DOCUMENTS

| | | | | |
|---|---|---|---|---|
| 5,440,239 A | * | 8/1995 | Zappella et al. ............. 324/757 |
| 5,801,536 A | * | 9/1998 | Brambilla et al. ........... 324/522 |
| 5,840,417 A | * | 11/1998 | Bolger ........................ 428/323 |
| 6,020,633 A | * | 2/2000 | Erickson ..................... 257/723 |
| 6,040,530 A | * | 3/2000 | Wharton et al. ............ 324/409 |
| 6,075,710 A | * | 6/2000 | Lau ............................. 361/760 |
| 6,121,554 A | * | 9/2000 | Kamikawa .................. 174/260 |
| 6,288,559 B1 | * | 9/2001 | Bernier et al. .............. 324/755 |
| 6,326,555 B1 | * | 12/2001 | McCormack et al. ....... 174/255 |
| 6,400,174 B2 | * | 6/2002 | Akram et al. ............... 324/765 |
| 6,483,329 B1 | * | 11/2002 | Cram ........................... 324/754 |
| 6,535,005 B1 | * | 3/2003 | Field ........................... 324/755 |
| 6,564,986 B1 | * | 5/2003 | Hsieh .......................... 324/500 |

* cited by examiner

*Primary Examiner*—Ernest Karlsen
*Assistant Examiner*—Jermele Hollington

(57) ABSTRACT

A test assembly for an integrated circuit package includes a package substrate and a test board. The package substrate is provided with a plurality of first contact pads linked in a first daisy chain pattern. The test board has a plurality of second contact pads linked in a second daisy chain pattern and a plurality of test pads. All of the second contact pads are divided into a plurality of groups each connected to one pair of test pads. All of the second contact pads in any group are arranged in a line. The present invention further provides a method of testing an integrated circuit package utilizing the aforementioned package substrate and test board.

2 Claims, 4 Drawing Sheets

TEST ASSEMBLY FOR INTEGRATED CIRCUIT PACKAGE

BACKGROUND OF THE INVENTION

1. Field of the Invention

The present invention generally relates to a semiconductor device test board and a method for testing an integrated circuit (IC) package, and more particularly to a test board and a testing method for an integrated circuit package having solder bumps.

2. Description of the Related Art

As electronic devices have become more smaller and thinner, the velocity and the complexity of chip become more and more higher. Accordingly, a need has arisen for higher package efficiency. To meet the need, integrated circuit packages using solder bumps as external connection terminals have been developed by the semiconductor industry.

The above described integrated circuit package are subjected to various tests such as a solder joint reliability test with the solder bumps connected to a test board.

A conventional semiconductor device test board 100, shown in FIG. 1, includes a plurality of contact pads 110 as denoted with A1 to U21 in FIG. 1 and a plurality of test pads 120 as denoted with 1 to 17 in FIG. 1. The contact pads 110 and the test pads 120 are all interconnected by conductive traces 130. The contact pads 110 are designed to be connected to the solder bumps (not shown) provided on an integrated circuit package to be tested. Accordingly, when the integrated circuit package is mounted on the test board 100, the solder bumps provided on the integrated circuit package are connected by reflow soldering to the contact pads 110 of the test board 100. Thereafter, the solder joint reliability test is conducted by using an ohmmeter to determine whether the electrical connections are complete in such a connected state. If the measured resistance of the major test pads S and E is larger than a predetermined value, it means that at least one solder joint fails in the test. In this situation, every pair of test pads (such as ½, ⅔ ... illustrated in FIG. 1) will be probed to measure their resistance so as to find out which group of solder joints fails in the test.

Then, a failure analysis is conducted to find out which solder joint fails in the test. First, the integrated circuit package mounted on the test board is embedded in a piece of resin, and then a grinding operation is conducted to expose the cross section of the solder joints. Finally, a scanning electron microscope (SEM) is utilized to observe the cross section.

It is noted that the contact pads 110 connected between one pair of test pads 120 are randomly distributed in different rows. Since the grinding operation must be conducted from outer rows to inner rows, there is a problem that the SEM failure analysis becomes a time-consuming process when the test board 100 shown in FIG. 1 is used.

Consequently, there is a need existed for a semiconductor device test board and a method for testing an integrated circuit package which overcomes, or at least reduces the above-mentioned problems of the prior art.

SUMMARY OF THE INVENTION

It is an object of the present invention to provide a test assembly including a package substrate and a test board for an integrated circuit package and a method of testing an integrated circuit package which can significantly reduce the time for conducting the SEM failure analysis.

To achieve the above listed and other objects, the package substrate of the present invention is provided with a plurality of first contact pads and the test board of the present invention has a plurality of second contact pads and a plurality of test pads wherein all of the second contact pads are divided into a plurality of groups each connected to one pair of test pads, and all of the second contact pads in the same group are arranged in a line.

The first contact pads of the package substrate are adapted for receiving solder bumps. Selected pairs of the first contact pads are connected together to form a first daisy chain portion. Selected pairs of the second contact pads are connected together to form a second daisy chain portion. When the integrated circuit package is mounted on the test board with each solder bump soldered to a corresponding contact pad, all of the pairs of connected second contact pads and corresponding pairs of connected first contact pads form a conductive path (i.e., the "daisy chain") that passes through all of the solder bumps therebetween.

According to the present invention, the testing method comprises the following steps: (a) mounting an integrated circuit package with the above mentioned substrate on the test board by reflowing solder bumps provided on the integrated circuit package to the second contact pads of the test board, and (b) performing an electrical test after conducting the mounting step.

In step (b), each group of connected second contact pads and corresponding connected first contact pads form a closed circuit through all of the older bumps therebetween when a corresponding pair of test pads are probed. Furthermore, the test board includes a pair of major test pads such that all of the second contact pads form a closed circuit when the pair of major test pads is probed.

It is noted that, when one pair of the test pads is probed, all of the second contact pads in the corresponding group are arranged in a line. Since the grinding operation of the SEM failure analysis is conducted from outer rows to inner rows, the time for conducting the SEM failure analysis is significantly reduced when the package substrate and the test board of the present invention are used.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
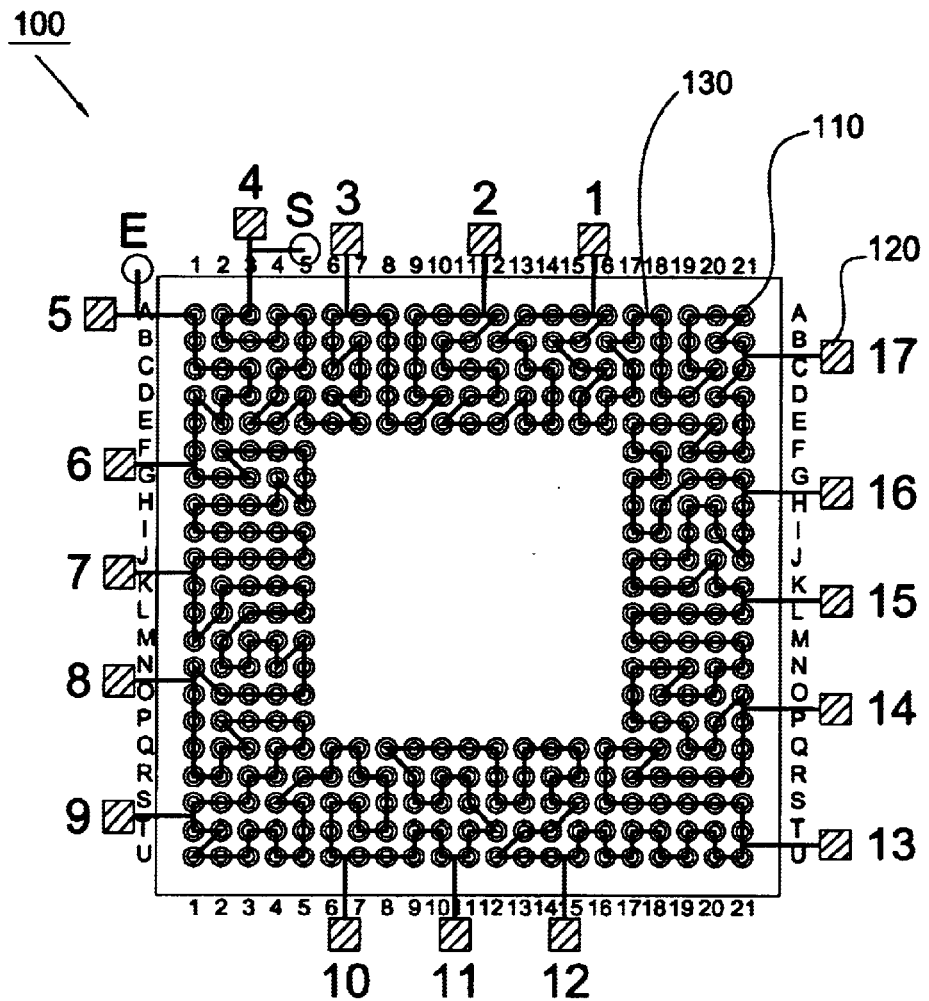
FIG. 1 is a top plan view of a conventional semiconductor device test board.
Figure 2:
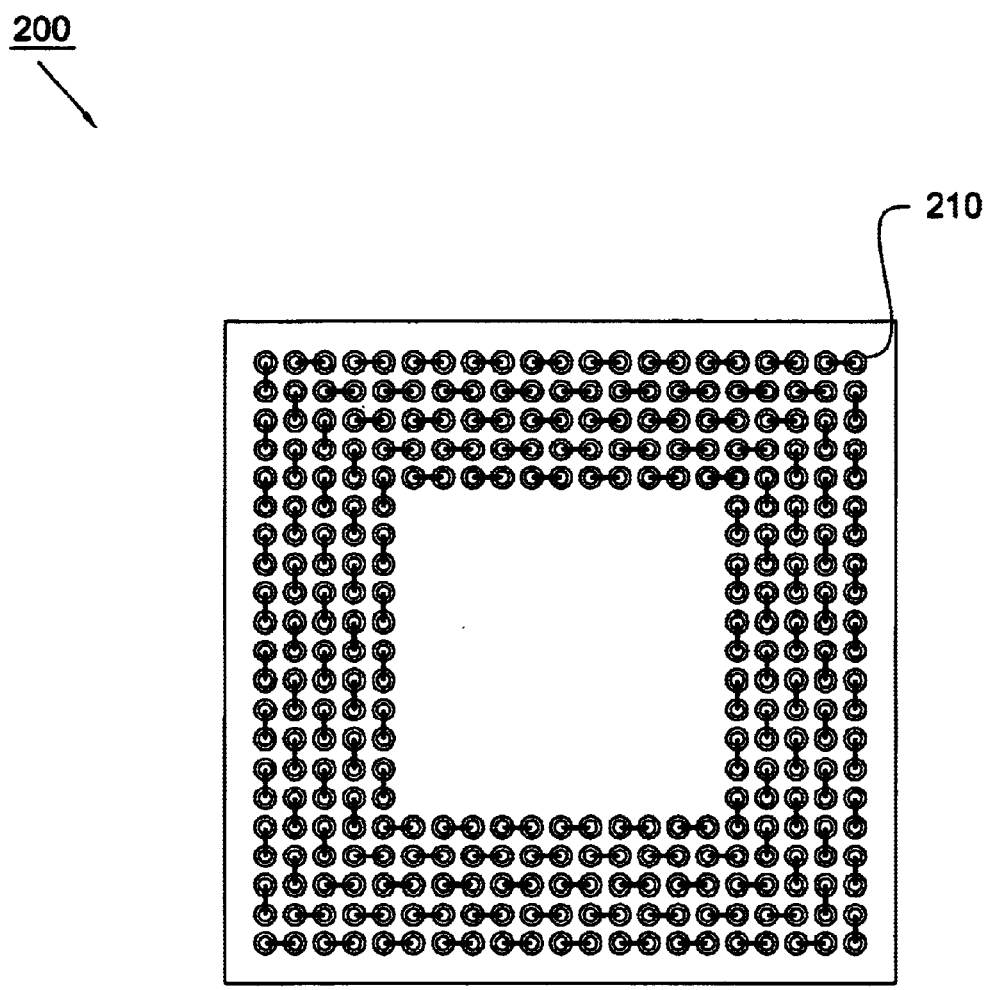
FIG. 2 is a top plan view of a package substrate according to one embodiment of the present invention.

In the IC package testing method according to the present invention, the IC package (not shown) has a package substrate 200 (see FIG. 2) specially designed for solder joint reliability test. The package substrate 200 is of the same size and shape as the substrates for mass production. The package substrate 200 is provided with a plurality of first contact pads 210. The package substrate 200 is a ball grid array (BGA) substrate.

The first contact pads 210 of the package substrate 200 are adapted for receiving solder bumps (not shown). Selected pairs of contact pads 210 are respectively connected by conductors (illustrated as bold lines in FIG. 2) to form a first (upper) half of a daisy chain (hereinafter referred to as "the first daisy chain portion").

Figure 3:
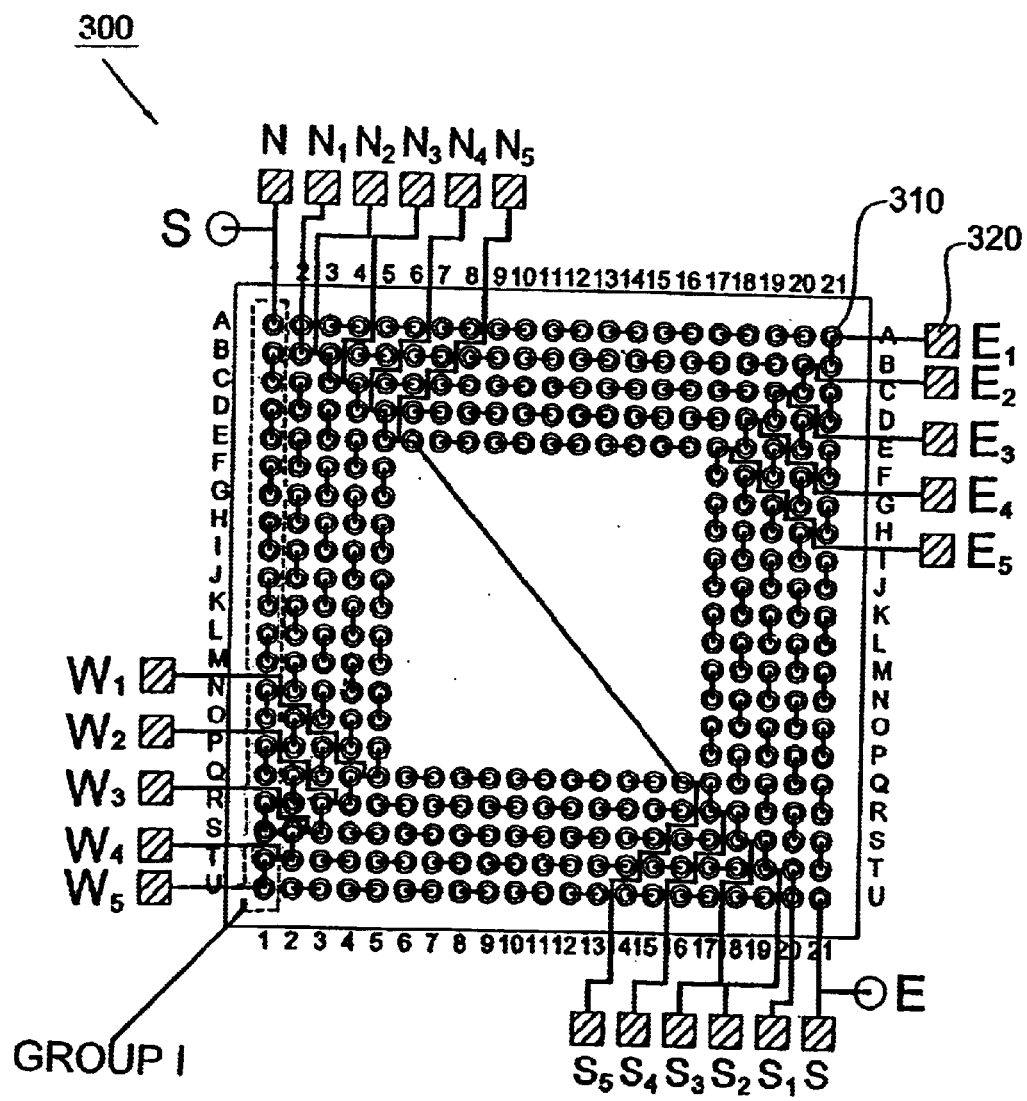
FIG. 3 is a top plan view of a semiconductor device test board according to one embodiment of the present invention.

The test board 300 according to one embodiment of the present invention, shown in FIG. 3, includes a plurality of second contact pads 310 as denoted with A1 to U21 in FIG. 3 and a plurality of test pads such as test pads N to N5 in FIG. 3. All of the contact pads 310 are linked in a second daisy chain pattern and divided into a plurality of groups each connected to one pair of test pads wherein all of the second contact pads 310 in the same group are arranged in a line. For example, the contact pads A1 to U1 are belonged to the same group (hereinafter referred to as "GROUP I"), connected to the test pads N and W5. As described below, the contact pads 310 are designed to be connected to the solder bumps provided on an IC package to be tested.

Selected pairs of second contact pads 310 are respectively connected by conductors (illustrated as bold lines in FIG. 3) to form a second (lower) half of a daisy chain (hereinafter referred to as "the second daisy chain portion").

Now a testing method according to one embodiment of the present invention will be described, which is performed on an IC package with the above mentioned substrate 200 using the test board 300 of the above structure.

First of all, a mounting step is performed for mounting the IC package on the test board. Mounting is performed after the solder bumps formed on the IC package are aligned with the second contact pads of the test board. Then, by reflowing the solder bumps to the second contact pads of the test board, the IC package is fixed to the test board. When the IC package is mounted as described above, the first contact pads 210 are electrically connected to the corresponding second contact pads 310 through the solder bumps.

Figure 4:
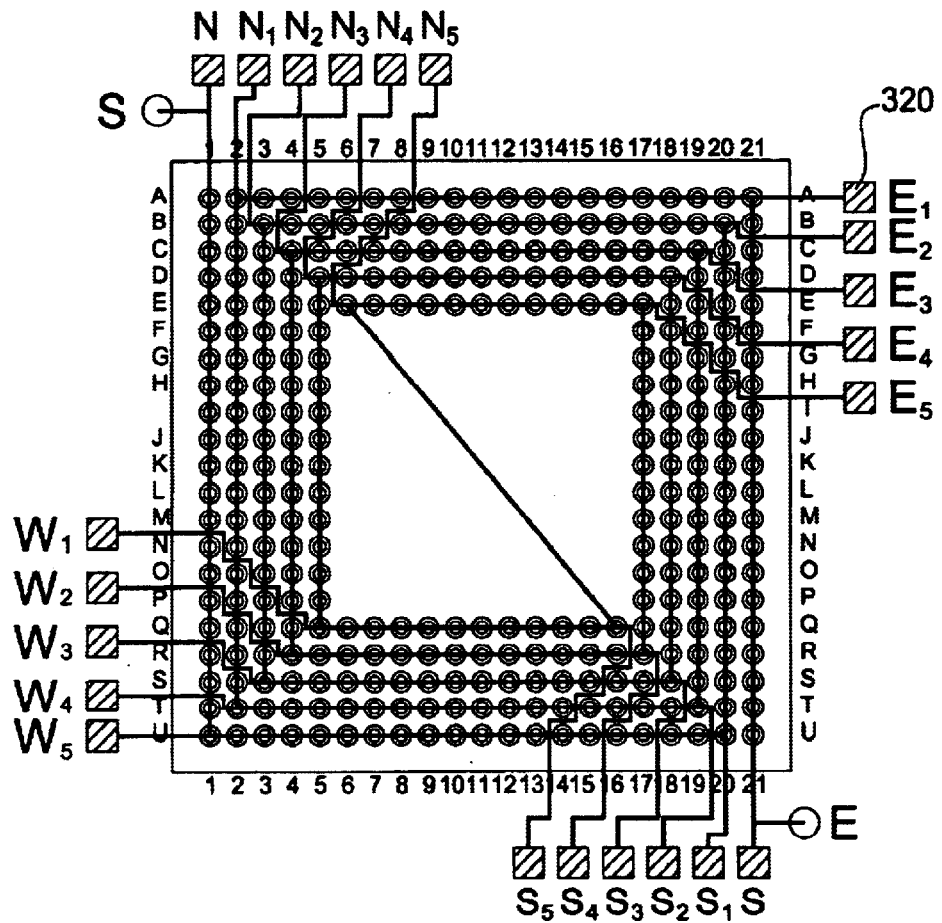
FIG. 4 illustrates an integrated circuit package with the substrate of FIG. 2 mounted on the test board of FIG. 3.

Then, after conducting the mounting step, the probes of an ohmmeter are connected to the test pads 320 of the test board 300, and an electrical test is performed to determine whether the electrical connections are complete. When the IC package is mounted on the test board, all of the pairs of connected second contact pads 310 and corresponding pairs of connected first contact pads 210 form a conductive path (i.e., the "daisy chain") that passes through all of the solder bumps (not shown) therebetween. When one pair of the test pads 320, e.g., the test pads N/W5 shown in FIG 3, is probed, all of connected second contact pads 310 in the same group connected to the test pads N/W5, i.e., GROUP I, and corresponding first contact pads 210 form a closed circuit through all of the solder bumps (not shown). Therefore, when the measured resistance of the major test pads S and E is larger than a predetermined value, it means that at least one solder joint fails the test. In this situation, every pair of test pads (such as N/W5, N1/W4 ... illustrated in FIG 4) will be probed to measure their resistance so as to find out which group of solder joints fails in the test.

Then, a failure analysis is conducted to find out which solder joint fails in the test. First, the integrated circuit package mounted on the test board is embedded in a piece of resin, and then a grinding operation is conducted to expose the cross section of the solder joints. Finally, a scanning electron microscope (SEM) is utilized to observe the cross section.

It is noted that, in the test board 300 according to one preferred embodiment of the present invention, all of the second contact pads in the same group are arranged in a line.

Since the grinding operation must be conducted from outer rows to inner rows, the time for conducting the SEM failure analysis is significantly reduced when the package substrate and the test board of the present invention are used.

The IC package testing method according to the present invention may be utilized to test the reliability of the solder joints under environmental stress conditions such as temperature cyclic test, three point bending test, vibration test, and drop test.

Although the invention has been explained in relation to its preferred embodiments as described above, it is to be understood that many other possible modifications and variations can be made without departing from the spirit and scope of the invention as hereinafter claimed.

What is claimed is:

1. In combination, an IC package having a plurality of first contact pads and a plurality of first conductors connecting selected ones of said first contact pads to define a first circuit portion; and a test board having a plurality of second contact pads and a plurality of second conductors connecting selected ones of the second contact pads to define a second circuit portion, the test board further comprising a plurality of pairs of test pads, each of the test pads being connected to one of said second contact pads;

wherein, when the IC package is mounted on the test board by a plurality of solder bumps each being disposed between and soldered to one of the first contact pads and one of the second contact pads.

the first and second circuit portions are connected to define a conductive path that passes through all of the solder bumps which are connected in series in said conductive path by said first and second contact pads and conductors, and a closed circuit is formed from a segment of said conductive path when each of said pairs of test pads is probed, said closed circuit including a number of said second contact pads all of which are physically arranged along a single straight line; and wherein said conductive path includes two spiral sections extending around a central area of the test board, an end of one of said spiral sections is connected to an end of the other spiral section by one of said second conductors, the other ends of said spirals sections are connected to two major test pads so that the entire conductive path belong to a closed circuit when said major test pads are probed.

2. In combination, an IC package having a plurality of first contact pads and a plurality of first conductors connecting selected ones of said first contact pads to define a first circuit portion; and a test board having a plurality of second contact pads and a plurality of second conductors connecting selected ones of the second contact pads to define a second circuit portion, the test board further comprising a plurality of pairs of test pads, each of the test pads being connected to one of said second contact pads;

wherein, when the IC package is mounted on the test board by a plurality of solder bumps each being disposed between and soldered to one of the first contact pads and one of the second contact pads, the first and second circuit portions are connected to define a conductive oath that passes through all of the solder bumps which are connected in series in said conductive path by said first and second contact pads and conductors, and a closed circuit is formed from a segment of said conductive path when each of said pairs of test pads is probed, said closed circuit including a number of said second contact pads all of which are physically arranged along a single straight line; and wherein the second contact pads of the closed circuits corresponding to said pairs of test pads are physically arranged in straight lines parallel to edges of said test board;

each of said second conduct connects only two adjacent said second contact pads; and said conductive path includes two spiral sections extending around a central area of the test board, an end of one of said spiral sections is connected to an end of the other spiral section by one of said second conductors, the other ends of said spirals sections are connected to two major test pads so that the entire conductive path belong to a closed circuit when said major test pads are probed.

* * * * *